United States Patent
Polishchuk et al.

(10) Patent No.: US 10,446,656 B2
(45) Date of Patent: Oct. 15, 2019

(54) MEMORY TRANSISTOR WITH MULTIPLE CHARGE STORING LAYERS AND A HIGH WORK FUNCTION GATE ELECTRODE

(71) Applicant: LONGITUDE FLASH MEMORY SOLUTIONS LTD., Dublin (IE)

(72) Inventors: Igor Polishchuk, Fremont, CA (US); Sagy Charel Levy, Zichron Yaakov (IL); Krishnaswamy Ramkumar, San Jose, CA (US)

(73) Assignee: LONGITUDE FLASH MEMORY SOLUTIONS LTD., Dublin (IE)

( * ) Notice: Subject to any disclaimer, the term of this patent is extended or adjusted under 35 U.S.C. 154(b) by 0 days.

(21) Appl. No.: 15/376,282

(22) Filed: Dec. 12, 2016

(65) Prior Publication Data

US 2017/0186883 A1 Jun. 29, 2017

Related U.S. Application Data

(60) Continuation of application No. 15/335,180, filed on Oct. 26, 2016, now Pat. No. 9,929,240, which is a
(Continued)

(51) Int. Cl.
*H01L 27/00* (2006.01)
*H01L 29/00* (2006.01)
(Continued)

(52) U.S. Cl.
CPC .......... *H01L 29/4234* (2013.01); *B82Y 10/00* (2013.01); *G11C 16/0466* (2013.01);
(Continued)

(58) Field of Classification Search
CPC ............. H01L 29/792; H01L 29/42344; H01L 29/518; H01L 29/4916; H01L 29/512;
(Continued)

(56) References Cited

U.S. PATENT DOCUMENTS

| 4,257,832 A | 3/1981 | Schwabe et al. |
| 4,395,438 A | 7/1983 | Chiang |

(Continued)

FOREIGN PATENT DOCUMENTS

| CN | 1107254 A | 8/1995 |
| CN | 1801478 A | 7/2006 |

(Continued)

OTHER PUBLICATIONS

Lue, Hang-Ting et al., "Reliability Model of Bandgap Engineered SONOS (be-SONOS)", IEEE, 2006, 4 pgs.
(Continued)

*Primary Examiner* — Nikolay K Yushin
(74) *Attorney, Agent, or Firm* — Kunzler Bean & Adamson

(57) ABSTRACT

Semiconductor devices including non-volatile memory transistors and methods of fabricating the same to improve performance thereof are provided. In one embodiment, the memory transistor comprises an oxide-nitride-oxide (ONO) stack on a surface of a semiconductor substrate, and a high work function gate electrode formed over a surface of the ONO stack. Preferably, the gate electrode comprises a doped polysilicon layer, and the ONO stack comprises multi-layer charge storing layer including at least a substantially trap free bottom oxynitride layer and a charge trapping top oxynitride layer. More preferably, the device also includes a metal oxide semiconductor (MOS) logic transistor formed on the same substrate, the logic transistor including a gate oxide and a high work function gate electrode. In certain embodiments, the dopant is a P+ dopant and the memory transistor comprises N-type (NMOS) silicon-oxide-nitride-oxide-silicon (SONOS) transistor while the logic transistor a P-type (PMOS) transistor. Other embodiments are also disclosed.

17 Claims, 4 Drawing Sheets

Related U.S. Application Data continuation of application No. 14/811,346, filed on Jul. 28, 2015, now Pat. No. 9,502,543, which is a continuation of application No. 14/159,315, filed on Jan. 20, 2014, now Pat. No. 9,093,318, which is a continuation of application No. 13/539,466, filed on Jul. 1, 2012, now Pat. No. 8,633,537, which is a continuation-in-part of application No. 13/288,919, filed on Nov. 3, 2011, now Pat. No. 8,859,374, which is a division of application No. 12/152,518, filed on May 13, 2008, now Pat. No. 8,063,434.

(60) Provisional application No. 60/940,160, filed on May 25, 2007.

(51) Int. Cl.
*H01L 29/423* (2006.01)
*H01L 29/792* (2006.01)
*H01L 29/51* (2006.01)
*H01L 29/66* (2006.01)
*B82Y 10/00* (2011.01)
*H01L 21/28* (2006.01)
*H01L 27/11526* (2017.01)
*G11C 16/04* (2006.01)
*H01L 27/11563* (2017.01)
*H01L 29/49* (2006.01)
*H01L 21/02* (2006.01)
*H01L 29/06* (2006.01)
*H01L 27/11568* (2017.01)
*H01L 27/11573* (2017.01)
*H01L 27/11575* (2017.01)

(52) U.S. Cl.
CPC .... *H01L 21/0214* (2013.01); *H01L 21/02532* (2013.01); *H01L 21/02595* (2013.01); *H01L 21/28282* (2013.01); *H01L 27/11526* (2013.01); *H01L 27/11563* (2013.01); *H01L 27/11568* (2013.01); *H01L 27/11573* (2013.01); *H01L 27/11575* (2013.01); *H01L 29/0649* (2013.01); *H01L 29/0676* (2013.01); *H01L 29/42344* (2013.01); *H01L 29/4916* (2013.01); *H01L 29/511* (2013.01); *H01L 29/512* (2013.01); *H01L 29/513* (2013.01); *H01L 29/518* (2013.01); *H01L 29/66795* (2013.01); *H01L 29/66833* (2013.01); *H01L 29/792* (2013.01); *H01L 29/7926* (2013.01)

(58) Field of Classification Search
CPC ........... H01L 29/0649; H01L 27/11575; H01L 27/11573; H01L 27/11568; B82Y 10/00; G11C 16/0466
See application file for complete search history.

(56) References Cited

U.S. PATENT DOCUMENTS

| | | | |
|---|---|---|---|
| 4,490,900 A | 1/1985 | Chiu | |
| 4,543,707 A | 10/1985 | Ito et al. | |
| 4,667,217 A | 5/1987 | Janning | |
| 4,843,023 A | 6/1989 | Chiu et al. | |
| 4,870,470 A | 9/1989 | Bass et al. | |
| 5,179,038 A * | 1/1993 | Kinney | H01L 21/763 257/E21.572 |
| 5,348,903 A | 9/1994 | Pfiester et al. | |
| 5,404,791 A | 4/1995 | Kervagoret | |
| 5,405,791 A | 4/1995 | Ahmad et al. | |
| 5,408,115 A | 4/1995 | Chang | |
| 5,464,783 A | 11/1995 | Kim et al. | |
| 5,500,816 A | 3/1996 | Kobayashi | |
| 5,543,336 A | 8/1996 | Enami et al. | |
| 5,550,078 A | 8/1996 | Sung | |
| 5,573,963 A | 11/1996 | Sung | |
| 5,773,343 A | 6/1998 | Lee et al. | |
| 5,793,089 A | 8/1998 | Fulford et al. | |
| 5,817,170 A | 10/1998 | Desu et al. | |
| 5,847,411 A | 12/1998 | Morii | |
| 5,861,347 A | 1/1999 | Maiti et al. | |
| 5,937,323 A | 8/1999 | Orczyk et al. | |
| 5,939,333 A | 8/1999 | Hurley et al. | |
| 5,972,765 A | 10/1999 | Clark et al. | |
| 5,972,804 A | 10/1999 | Tobin et al. | |
| 6,001,713 A | 12/1999 | Ramsbey et al. | |
| 6,015,739 A | 1/2000 | Gardner et al. | |
| 6,020,606 A | 2/2000 | Liao | |
| 6,023,093 A | 2/2000 | Gregor et al. | |
| 6,025,267 A | 2/2000 | Pey et al. | |
| 6,074,915 A | 6/2000 | Chen et al. | |
| 6,114,734 A | 9/2000 | Eklund | |
| 6,127,227 A | 10/2000 | Lin et al. | |
| 6,136,654 A | 10/2000 | Kraft et al. | |
| 6,140,187 A | 10/2000 | Debusk et al. | |
| 6,147,014 A | 11/2000 | Lyding et al. | |
| 6,150,286 A | 11/2000 | Sun et al. | |
| 6,153,543 A | 11/2000 | Chesire et al. | |
| 6,157,426 A | 12/2000 | Gu | |
| 6,162,700 A | 12/2000 | Hwang et al. | |
| 6,174,758 B1 * | 1/2001 | Nachumovsky | H01L 21/76213 257/369 |
| 6,174,774 B1 | 1/2001 | Lee | |
| 6,214,689 B1 | 4/2001 | Lim et al. | |
| 6,217,658 B1 | 4/2001 | Orczyk et al. | |
| 6,218,700 B1 | 4/2001 | Papadas | |
| 6,268,299 B1 | 7/2001 | Jammy et al. | |
| 6,277,683 B1 | 8/2001 | Pradeep et al. | |
| 6,287,913 B1 | 9/2001 | Agnello et al. | |
| 6,297,096 B1 | 10/2001 | Boaz | |
| 6,297,173 B1 | 10/2001 | Tobin et al. | |
| 6,321,134 B1 | 11/2001 | Henley et al. | |
| 6,335,288 B1 | 1/2002 | Kwan et al. | |
| 6,348,380 B1 | 2/2002 | Weimer et al. | |
| 6,365,518 B1 | 4/2002 | Lee et al. | |
| 6,399,484 B1 | 6/2002 | Yamasaki et al. | |
| 6,406,960 B1 | 6/2002 | Hopper et al. | |
| 6,429,081 B1 | 8/2002 | Doong et al. | |
| 6,433,383 B1 | 8/2002 | Ramsbey et al. | |
| 6,440,797 B1 | 8/2002 | Wu et al. | |
| 6,444,521 B1 | 9/2002 | Chang et al. | |
| 6,445,030 B1 | 9/2002 | Wu et al. | |
| 6,461,899 B1 | 10/2002 | Kitakado et al. | |
| 6,462,370 B2 * | 10/2002 | Kuwazawa | G11C 11/005 257/296 |
| 6,468,927 B1 | 10/2002 | Zhang et al. | |
| 6,469,343 B1 | 10/2002 | Miura et al. | |
| 6,518,113 B1 | 2/2003 | Buynoski | |
| 6,559,026 B1 | 5/2003 | Rossman et al. | |
| 6,573,149 B2 * | 6/2003 | Kizilyalli | H01L 21/28079 257/E21.202 |
| 6,586,343 B1 | 7/2003 | Ho et al. | |
| 6,586,349 B1 | 7/2003 | Jeon et al. | |
| 6,596,590 B1 | 7/2003 | Miura et al. | |
| 6,599,795 B2 | 7/2003 | Ogata | |
| 6,602,771 B2 | 8/2003 | Inoue et al. | |
| 6,610,614 B2 | 8/2003 | Niimi et al. | |
| 6,624,090 B1 | 9/2003 | Yu et al. | |
| 6,661,065 B2 | 12/2003 | Kunikiyo | |
| 6,670,241 B1 | 12/2003 | Kamal et al. | |
| 6,677,213 B1 | 1/2004 | Ramkumar et al. | |
| 6,709,928 B1 | 3/2004 | Jenne et al. | |
| 6,713,127 B2 | 3/2004 | Subramony et al. | |
| 6,717,860 B1 | 4/2004 | Fujiwara | |
| 6,730,566 B2 | 5/2004 | Niimi et al. | |
| 6,746,968 B1 | 6/2004 | Tseng et al. | |
| 6,768,160 B1 | 7/2004 | Li et al. | |
| 6,768,856 B2 | 7/2004 | Akwani et al. | |
| 6,774,433 B2 | 8/2004 | Lee et al. | |
| 6,787,419 B2 | 9/2004 | Chen et al. | |

(56) References Cited

U.S. PATENT DOCUMENTS

| | | | |
|---|---|---|---|
| 6,818,558 B1 * | 11/2004 | Rathor | H01L 27/115 257/E21.679 |
| 6,833,582 B2 | 12/2004 | Mine et al. | |
| 6,835,621 B2 | 12/2004 | Yoo et al. | |
| 6,867,118 B2 * | 3/2005 | Noro | H01L 27/105 257/E21.679 |
| 6,884,681 B1 | 4/2005 | Kamal et al. | |
| 6,903,422 B2 | 6/2005 | Goda et al. | |
| 6,906,390 B2 | 6/2005 | Nomoto et al. | |
| 6,912,163 B2 | 6/2005 | Zheng et al. | |
| 6,913,961 B2 | 7/2005 | Hwang | |
| 6,917,072 B2 | 7/2005 | Noguchi et al. | |
| 6,946,349 B1 | 9/2005 | Lee et al. | |
| 6,958,511 B1 | 10/2005 | Halliyal et al. | |
| 7,012,299 B2 | 3/2006 | Mahajani et al. | |
| 7,015,100 B1 | 3/2006 | Lee et al. | |
| 7,018,868 B1 | 3/2006 | Yang et al. | |
| 7,033,890 B2 | 4/2006 | Shone | |
| 7,033,957 B1 | 4/2006 | Shiraiwa et al. | |
| 7,042,054 B1 | 5/2006 | Ramkumar et al. | |
| 7,045,424 B2 | 5/2006 | Kim et al. | |
| 7,060,594 B2 | 6/2006 | Wang | |
| 7,084,032 B2 | 8/2006 | Crivelli et al. | |
| 7,098,154 B2 | 8/2006 | Yoneda | |
| 7,112,486 B2 | 9/2006 | Cho et al. | |
| 7,115,469 B1 | 10/2006 | Halliyal et al. | |
| 7,172,940 B1 | 2/2007 | Chen et al. | |
| 7,189,606 B2 * | 3/2007 | Wang | H01L 21/84 257/E21.654 |
| 7,230,294 B2 * | 6/2007 | Lee | H01L 27/105 257/314 |
| 7,238,990 B2 | 7/2007 | Burnett et al. | |
| 7,250,654 B2 | 7/2007 | Chen et al. | |
| 7,253,046 B2 | 8/2007 | Higashi et al. | |
| 7,262,457 B2 | 8/2007 | Hsu et al. | |
| 7,279,740 B2 | 10/2007 | Bhattacharyya et al. | |
| 7,301,185 B2 | 11/2007 | Chen et al. | |
| 7,312,496 B2 | 12/2007 | Hazama | |
| 7,315,474 B2 | 1/2008 | Lue | |
| 7,323,742 B2 | 1/2008 | Georgescu | |
| 7,338,869 B2 | 3/2008 | Fukada et al. | |
| 7,365,389 B1 | 4/2008 | Jeon et al. | |
| 7,372,113 B2 | 5/2008 | Tanaka et al. | |
| 7,390,718 B2 | 6/2008 | Roizin et al. | |
| 7,410,857 B2 | 8/2008 | Higashi et al. | |
| 7,425,491 B2 | 9/2008 | Forbes | |
| 7,450,423 B2 | 11/2008 | Lai et al. | |
| 7,463,530 B2 | 12/2008 | Lue et al. | |
| 7,479,425 B2 | 1/2009 | Ang et al. | |
| 7,482,236 B2 | 1/2009 | Lee et al. | |
| 7,521,751 B2 | 4/2009 | Fujiwara | |
| 7,535,053 B2 | 5/2009 | Yamazaki | |
| 7,544,565 B2 | 6/2009 | Kwak et al. | |
| 7,576,386 B2 | 8/2009 | Lue et al. | |
| 7,588,986 B2 | 9/2009 | Jung | |
| 7,601,576 B2 | 10/2009 | Suzuki et al. | |
| 7,612,403 B2 | 11/2009 | Bhattacharyya | |
| 7,636,257 B2 | 12/2009 | Lue | |
| 7,642,585 B2 | 1/2010 | Wang et al. | |
| 7,646,041 B2 | 1/2010 | Chae et al. | |
| 7,646,637 B2 | 1/2010 | Liao | |
| 7,670,963 B2 | 3/2010 | Ramkumar et al. | |
| 7,688,626 B2 | 3/2010 | Lue et al. | |
| 7,692,246 B2 | 4/2010 | Dreeskornfeld et al. | |
| 7,713,810 B2 | 5/2010 | Hagemeyer et al. | |
| 7,714,379 B2 | 5/2010 | Lee | |
| 7,723,789 B2 | 5/2010 | Lin et al. | |
| 7,737,488 B2 | 6/2010 | Lai et al. | |
| 7,790,516 B2 | 9/2010 | Willer et al. | |
| 7,811,890 B2 | 10/2010 | Hsu et al. | |
| 7,879,738 B2 | 2/2011 | Wang | |
| 7,910,429 B2 | 3/2011 | Dong et al. | |
| 7,927,951 B2 | 4/2011 | Kim et al. | |
| 7,948,799 B2 | 5/2011 | Lue et al. | |
| 7,972,930 B2 | 7/2011 | Jang et al. | |
| 7,999,295 B2 | 8/2011 | Lai et al. | |
| 8,008,713 B2 | 8/2011 | Dobuzinsky et al. | |
| 8,063,434 B1 | 11/2011 | Polishchuk et al. | |
| 8,067,284 B1 | 11/2011 | Levy | |
| 8,071,453 B1 | 12/2011 | Ramkumar et al. | |
| 8,093,128 B2 | 1/2012 | Koutny et al. | |
| 8,143,129 B2 | 3/2012 | Ramkumar et al. | |
| 8,163,660 B2 | 4/2012 | Puchner et al. | |
| 8,222,688 B1 | 7/2012 | Jenne et al. | |
| 8,264,028 B2 | 9/2012 | Lue et al. | |
| 8,283,261 B2 | 10/2012 | Ramkumar | |
| 8,315,095 B2 | 11/2012 | Lue et al. | |
| 8,318,608 B2 | 11/2012 | Ramkumar et al. | |
| 8,482,052 B2 | 7/2013 | Lue et al. | |
| 8,633,537 B2 | 1/2014 | Polishchuk et al. | |
| 8,643,124 B2 | 2/2014 | Levy et al. | |
| 8,710,578 B2 | 4/2014 | Jenne et al. | |
| 8,859,374 B1 | 10/2014 | Polishchuk et al. | |
| 8,860,122 B1 | 10/2014 | Polishchuk et al. | |
| 8,940,645 B2 | 1/2015 | Ramkumar et al. | |
| 8,993,453 B1 | 3/2015 | Ramkumar et al. | |
| 9,093,318 B2 | 7/2015 | Polishchuk et al. | |
| 9,306,025 B2 | 4/2016 | Polishchuk et al. | |
| 9,349,824 B2 | 5/2016 | Levy et al. | |
| 9,355,849 B1 | 5/2016 | Levy et al. | |
| 9,449,831 B2 | 9/2016 | Levy et al. | |
| 9,502,543 B1 | 11/2016 | Polishchuk et al. | |
| 9,929,240 B2 | 3/2018 | Polishchuk et al. | |
| 2001/0052615 A1 | 12/2001 | Fujiwara | |
| 2002/0020890 A1 | 2/2002 | Willer | |
| 2002/0048200 A1 * | 4/2002 | Kuwazawa | G11C 11/005 365/200 |
| 2002/0048893 A1 * | 4/2002 | Kizilyalli | H01L 21/28079 438/383 |
| 2002/0109138 A1 | 8/2002 | Forbes | |
| 2002/0141237 A1 | 10/2002 | Goda et al. | |
| 2002/0154878 A1 | 10/2002 | Akwani et al. | |
| 2003/0030100 A1 | 2/2003 | Lee et al. | |
| 2003/0122204 A1 | 7/2003 | Nomoto et al. | |
| 2003/0123307 A1 | 7/2003 | Lee et al. | |
| 2003/0124873 A1 | 7/2003 | Xing et al. | |
| 2003/0169629 A1 | 9/2003 | Goebel et al. | |
| 2003/0183869 A1 | 10/2003 | Crivelli et al. | |
| 2003/0222293 A1 * | 12/2003 | Noro | H01L 27/105 257/296 |
| 2003/0227049 A1 | 12/2003 | Sakakibara | |
| 2003/0227056 A1 * | 12/2003 | Wang | H01L 21/84 257/347 |
| 2004/0067619 A1 | 4/2004 | Niimi et al. | |
| 2004/0071030 A1 | 4/2004 | Goda et al. | |
| 2004/0094793 A1 | 5/2004 | Noguchi et al. | |
| 2004/0104424 A1 | 6/2004 | Yamazaki | |
| 2004/0129986 A1 | 7/2004 | Kobayashi et al. | |
| 2004/0129988 A1 | 7/2004 | Rotondaro et al. | |
| 2004/0173918 A1 | 9/2004 | Kamal et al. | |
| 2004/0183091 A1 | 9/2004 | Hibino | |
| 2004/0183122 A1 | 9/2004 | Mine et al. | |
| 2004/0207002 A1 | 10/2004 | Ryu et al. | |
| 2004/0227196 A1 | 11/2004 | Yoneda | |
| 2004/0227198 A1 | 11/2004 | Mitani et al. | |
| 2004/0251489 A1 | 12/2004 | Jeon et al. | |
| 2005/0026637 A1 | 2/2005 | Fischer et al. | |
| 2005/0056892 A1 | 3/2005 | Seliskar | |
| 2005/0062098 A1 | 3/2005 | Mahajani et al. | |
| 2005/0070126 A1 | 3/2005 | Senzaki | |
| 2005/0079659 A1 | 4/2005 | Duan et al. | |
| 2005/0088889 A1 * | 4/2005 | Lee | H01L 27/105 365/202 |
| 2005/0093054 A1 | 5/2005 | Jung | |
| 2005/0098839 A1 | 5/2005 | Lee et al. | |
| 2005/0110064 A1 | 5/2005 | Duan et al. | |
| 2005/0116279 A1 | 6/2005 | Koh | |
| 2005/0141168 A1 | 6/2005 | Lee et al. | |
| 2005/0186741 A1 | 8/2005 | Roizin et al. | |
| 2005/0205920 A1 | 9/2005 | Jeon et al. | |
| 2005/0224866 A1 | 10/2005 | Higashi et al. | |
| 2005/0227501 A1 | 10/2005 | Tanabe et al. | |
| 2005/0230766 A1 | 10/2005 | Nomoto et al. | |
| 2005/0236679 A1 | 10/2005 | Hori et al. | |

(56) References Cited

U.S. PATENT DOCUMENTS

| | | |
|---|---|---|
| 2005/0245034 A1 | 11/2005 | Fukuda et al. |
| 2005/0266637 A1 | 12/2005 | Wang |
| 2005/0275010 A1 | 12/2005 | Chen et al. |
| 2005/0275012 A1 | 12/2005 | Nara et al. |
| 2006/0008959 A1 | 1/2006 | Hagemeyer et al. |
| 2006/0017092 A1 | 1/2006 | Dong et al. |
| 2006/0051880 A1 | 3/2006 | Doczy et al. |
| 2006/0065919 A1 | 3/2006 | Fujiwara |
| 2006/0081331 A1 | 4/2006 | Campian |
| 2006/0111805 A1 | 5/2006 | Yokoyama et al. |
| 2006/0113586 A1 | 6/2006 | Wang |
| 2006/0113627 A1 | 6/2006 | Chen et al. |
| 2006/0131636 A1 | 6/2006 | Jeon et al. |
| 2006/0160303 A1 | 7/2006 | Ang et al. |
| 2006/0192248 A1 | 8/2006 | Wang |
| 2006/0202261 A1 | 9/2006 | Lue et al. |
| 2006/0202263 A1 | 9/2006 | Lee |
| 2006/0220106 A1 | 10/2006 | Choi et al. |
| 2006/0226490 A1 | 10/2006 | Burnett et al. |
| 2006/0228841 A1 | 10/2006 | Kim et al. |
| 2006/0228899 A1 | 10/2006 | Nansei et al. |
| 2006/0228907 A1 | 10/2006 | Cheng et al. |
| 2006/0237803 A1 | 10/2006 | Zhu et al. |
| 2006/0261401 A1 | 11/2006 | Bhattacharyya |
| 2006/0281331 A1 | 12/2006 | Wang |
| 2006/0284236 A1 | 12/2006 | Bhattacharyya |
| 2007/0012988 A1 | 1/2007 | Bhattacharyya |
| 2007/0022359 A1 | 1/2007 | Katoh et al. |
| 2007/0029625 A1 | 2/2007 | Lue et al. |
| 2007/0031999 A1 | 2/2007 | Ho et al. |
| 2007/0048916 A1 | 3/2007 | Suzuki et al. |
| 2007/0049048 A1 | 3/2007 | Rauf et al. |
| 2007/0051306 A1 | 3/2007 | Ivanov et al. |
| 2007/0066087 A1 | 3/2007 | Jung |
| 2007/0121380 A1 | 5/2007 | Thomas |
| 2007/0200168 A1 | 8/2007 | Ozawa et al. |
| 2007/0202708 A1 | 8/2007 | Luo et al. |
| 2007/0210371 A1 | 8/2007 | Hisamoto et al. |
| 2007/0215940 A1 | 9/2007 | Ligon |
| 2007/0231991 A1 | 10/2007 | Willer et al. |
| 2007/0232007 A1 | 10/2007 | Forbes |
| 2007/0246753 A1 | 10/2007 | Chu et al. |
| 2007/0262451 A1 | 11/2007 | Rachmady et al. |
| 2007/0267687 A1 | 11/2007 | Lue |
| 2007/0268753 A1 | 11/2007 | Lue et al. |
| 2007/0272916 A1 | 11/2007 | Wang et al. |
| 2007/0272971 A1 | 11/2007 | Lee et al. |
| 2008/0009115 A1 | 1/2008 | Willer et al. |
| 2008/0020853 A1 | 1/2008 | Ingebrigtson |
| 2008/0029399 A1 | 2/2008 | Tomita et al. |
| 2008/0048237 A1 | 2/2008 | Iwata |
| 2008/0054346 A1 | 3/2008 | Saitoh et al. |
| 2008/0057644 A1 | 3/2008 | Kwak et al. |
| 2008/0087942 A1 | 4/2008 | Hsu et al. |
| 2008/0087946 A1 | 4/2008 | Hsu et al. |
| 2008/0121932 A1 | 5/2008 | Ranade |
| 2008/0135946 A1* | 6/2008 | Yan .................. H01L 21/28282 257/390 |
| 2008/0146042 A1 | 6/2008 | Kostamo et al. |
| 2008/0150003 A1 | 6/2008 | Chen et al. |
| 2008/0175053 A1 | 7/2008 | Lue et al. |
| 2008/0230853 A1 | 9/2008 | Jang et al. |
| 2008/0237684 A1 | 10/2008 | Specht et al. |
| 2008/0237694 A1 | 10/2008 | Specht et al. |
| 2008/0258203 A1 | 10/2008 | Happ et al. |
| 2008/0272424 A1 | 11/2008 | Kim et al. |
| 2008/0286927 A1 | 11/2008 | Kim et al. |
| 2008/0290398 A1 | 11/2008 | Polishchuk et al. |
| 2008/0290399 A1 | 11/2008 | Levy et al. |
| 2008/0290400 A1 | 11/2008 | Jenne et al. |
| 2008/0291726 A1 | 11/2008 | Lue et al. |
| 2008/0293207 A1 | 11/2008 | Koutny et al. |
| 2008/0293254 A1 | 11/2008 | Ramkumar et al. |
| 2008/0293255 A1 | 11/2008 | Ramkumar |
| 2008/0296664 A1 | 12/2008 | Ramkumar et al. |
| 2009/0011609 A1 | 1/2009 | Ramkumar et al. |
| 2009/0039414 A1 | 2/2009 | Lue et al. |
| 2009/0039416 A1 | 2/2009 | Lai et al. |
| 2009/0045452 A1 | 2/2009 | Lue et al. |
| 2009/0065849 A1 | 3/2009 | Noda |
| 2009/0152618 A1 | 6/2009 | Matsuo et al. |
| 2009/0152621 A1 | 6/2009 | Polishchuk et al. |
| 2009/0179253 A1 | 7/2009 | Levy et al. |
| 2009/0206385 A1 | 8/2009 | Kim et al. |
| 2009/0227116 A1 | 9/2009 | Joo et al. |
| 2009/0242969 A1 | 10/2009 | Tanaka |
| 2009/0294836 A1 | 12/2009 | Kiyotoshi |
| 2009/0294844 A1 | 12/2009 | Tanaka et al. |
| 2009/0302365 A1 | 12/2009 | Bhattacharyya |
| 2010/0006922 A1 | 1/2010 | Matsuoka et al. |
| 2010/0041222 A1 | 2/2010 | Puchner et al. |
| 2010/0096687 A1 | 4/2010 | Balseanu et al. |
| 2010/0117138 A1 | 5/2010 | Huerta et al. |
| 2010/0117139 A1 | 5/2010 | Lue |
| 2010/0155823 A1 | 6/2010 | Lue et al. |
| 2010/0178759 A1 | 7/2010 | Kim et al. |
| 2010/0252877 A1 | 10/2010 | Nakanishi et al. |
| 2010/0270609 A1 | 10/2010 | Olsen et al. |
| 2010/0283097 A1 | 11/2010 | Endoh et al. |
| 2010/0295118 A1 | 11/2010 | Bhattacharyya |
| 2011/0018053 A1 | 1/2011 | Lo Guo et al. |
| 2011/0163371 A1 | 7/2011 | Song et al. |
| 2011/0233512 A1 | 9/2011 | Yang et al. |
| 2011/0237060 A1 | 9/2011 | Lee et al. |
| 2011/0248332 A1 | 10/2011 | Levy et al. |
| 2012/0007167 A1 | 1/2012 | Hung et al. |
| 2012/0068159 A1 | 3/2012 | Fujiki et al. |
| 2012/0068250 A1 | 3/2012 | Ino et al. |
| 2013/0048876 A1 | 2/2013 | Crawford |
| 2013/0175604 A1 | 7/2013 | Polishchuk et al. |
| 2013/0309826 A1 | 11/2013 | Ramkumar et al. |
| 2014/0264551 A1 | 9/2014 | Polishchuk et al. |
| 2016/0300724 A1 | 10/2016 | Levy et al. |

FOREIGN PATENT DOCUMENTS

| | | |
|---|---|---|
| CN | 1832201 A | 9/2006 |
| CN | 101517714 A | 8/2009 |
| CN | 101859702 A | 10/2010 |
| CN | 102142454 A | 8/2011 |
| CN | 101558481 B | 5/2012 |
| CN | 104254921 A | 12/2014 |
| JP | 2004172616 A | 6/2004 |
| JP | 2005183940 A | 7/2005 |
| JP | 2005347679 | 12/2005 |
| JP | 2005347679 A | 12/2005 |
| JP | 2007515060 A | 6/2007 |
| JP | 2007318112 | 12/2007 |
| JP | 2009027134 A | 2/2009 |
| JP | 2009535800 A | 10/2009 |
| JP | 2009260070 | 11/2009 |
| JP | 2009272348 A | 11/2009 |
| JP | 2010182939 A | 8/2010 |
| JP | 2011507231 A | 3/2011 |
| JP | 2011527824 A | 11/2011 |
| JP | 2012019211 A | 1/2012 |
| KR | 20040070669 A | 8/2004 |
| KR | 20060100092 | 9/2006 |
| TW | 200703671 A | 1/2007 |
| TW | 200847343 A | 12/2008 |
| WO | 2007064048 A1 | 6/2007 |
| WO | 2008129478 A | 10/2008 |
| WO | 2007022359 A3 | 5/2009 |
| WO | 2011162725 A1 | 12/2011 |
| WO | 2013148112 A1 | 10/2013 |
| WO | 2013148343 A1 | 10/2013 |

OTHER PUBLICATIONS

Milton Ohring, "The Materials Science of Thin Films: Deposition and Structure," 2nd Edition, Academic Press, 2002, pp. 336-337; 4 pages.

(56) References Cited

OTHER PUBLICATIONS

SIPO Office Action for Application No. 200910134374.1 dated Jan. 21, 2015; 5 pages.
SIPO Office Action for Application No. 200910134374.1 dated Feb. 3, 2016; 2 pages.
SIPO Office Action for Application No. 200910134374.1 dated Jul. 29, 2014; 5 pages.
SIPO Office Action for Application No. 200910134374.1 dated Jul. 30, 2015; 2 pages.
SIPO Office Action for Application No. 200910134374.1 dated Sep. 22, 2013; 4 pages.
SIPO Office Action for Application No. 20120000107.5 dated Apr. 1, 2015; 5 pages.
SIPO Office Action for Application No. 20120000107.5 dated May 12, 2016; 5 pages.
SIPO Office Action for Application No. 20120000107.5 dated Jul. 25, 2014; 4 pages.
SIPO Office Action for Application No. 20120000107.5 dated Oct. 9, 2015; 2 pages.
SIPO Office Action for Application No. 201280000107.5 dated Nov. 29, 2016; 5 pages.
SIPO Office Action for Application No. 2013800168932 dated Sep. 1, 2016; 7 pages.
SIPO Office Action for Application No. 201380031840.8 dated Jan. 6, 2017; 8 pages.
SIPO Office Action for CN Application No. 201380031969.9 dated Aug. 19, 2016; 8 pages.
TIPO Office Action for Application No. 102110223 dated Nov. 18, 2016; 10 pages.
TIPO Office Action for Taiwan Application No. 101101220 dated Oct. 15, 2015; 4 pages.
USPTO Advisory Action for U.S. Appl. No. 11/811,958 dated Mar. 16, 2010; 4 pages.
USPTO Advisory Action for U.S. Appl. No. 11/811,958 dated Apr. 20, 2010; 6 pages.
USPTO Advisory Action for U.S. Appl. No. 11/811,958 dated May 14, 2013; 4 pages.
USPTO Advisory Action for U.S. Appl. No. 11/811,958 dated Jun. 2, 2011; 5 pages.
USPTO Advisory Action for U.S. Appl. No. 12/197,466 dated Jan. 31, 2012; 3 pages.
USPTO Advisory Action for U.S. Appl. No. 13/114,889 dated Aug. 29, 2012; 3 pages.
USPTO Advisory Action for U.S. Appl. No. 13/436,872 dated Aug. 4, 2015; 2 pages.
USPTO Advisory Action for U.S. Appl. No. 14/605,231 dated Mar. 9, 2016; 3 pages.
USPTO Advisory Action for U.S. Appl. No. 14/605,231 dated Jul. 5, 2016; 3 pages.
USPTO Final Rejection for U.S. Appl. No. 11/811,958 dated Jan. 6, 2010; 17 pages.
USPTO Final Rejection for U.S. Appl. No. 11/811,958 dated Mar. 13, 2013; 22 pages.
USPTO Final Rejection for U.S. Appl. No. 11/811,958 dated Mar. 15, 2011; 13 pages.
USPTO Final Rejection for U.S. Appl. No. 12/124,855 dated Jan. 31, 2012; 7 pages.
USPTO Final Rejection for U.S. Appl. No. 12/124,855 dated May 10, 2010; 11 pages.
USPTO Final Rejection for U.S. Appl. No. 12/197,466 dated Nov. 17, 2011; 13 pages.
USPTO Final Rejection for U.S. Appl. No. 13/007,533 dated Sep. 24, 2012; 13 pages.
USPTO Final Rejection for U.S. Appl. No. 13/436,872 dated May 27, 2015; 14 pages.
USPTO Final Rejection for U.S. Appl. No. 14/307,858 dated Oct. 8, 2015; 6 pages.
USPTO Final Rejection for U.S. Appl. No. 14/605,231 dated Dec. 17, 2015; 15 pages.
USPTO Missing Parts for U.S. Appl. No. 13/539,466 dated Jul. 17, 2012; 2 pages.
USPTO Non Final Rejection for U.S. Appl. No. 11/811,958 dated Dec. 7, 2011; 13 pages.
USPTO Non Final Rejection for U.S. Appl. No. 13/007,533 dated Apr. 12, 2012; 9 pages.
USPTO Non Final Rejection for U.S. Appl. No. 13/539,458 dated Mar. 13, 2013; 5 pages.
USPTO Non Final Rejection for U.S. Appl. No. 13/539,458 dated Oct. 2, 2014; 5 pages.
USPTO Non Final Rejection for U.S. Appl. No. 13/620,071 dated Apr. 3, 2014; 12 pages.
USPTO Non Final Rejection for U.S. Appl. No. 13/620,071 dated Jul. 18, 2014; 5 pages.
USPTO Non-Final Rejection for U.S. Appl. No. 11/811,958 dated May 13, 2009; 14 pages.
USPTO Non-Final Rejection for U.S. Appl. No. 11/811,958 dated Oct. 1, 2012; 17 pages.
USPTO Non-Final Rejection for U.S. Appl. No. 11/811,958 dated Oct. 7, 2010; 12 pages.
USPTO Non-Final Rejection for U.S. Appl. No. 12/124,855 dated Jan. 18, 2011; 5 pages.
USPTO Non-Final Rejection for U.S. Appl. No. 12/124,855 dated Aug. 16, 2011; 9 pages.
USPTO Non-Final Rejection for U.S. Appl. No. 12/124,855 dated Oct. 29, 2009; 9 pages.
USPTO Non-Final Rejection for U.S. Appl. No. 12/152,518 dated Mar. 9, 2011; 4 pages.
USPTO Requirement Restriction for U.S. Appl. No. 12/197,466 dated Mar. 11, 2011; 5 pages.
Wang, Szu-Yu et al., "Reliability and processing effects of bandgap engineered SONOS flash memory", 2007 IEEE, International Reliability Symposium, Apr. 18, 2007, 5 pgs.
Written Opinion of the International Searching Authority for International Application No. PCT/US08/06627 dated Aug. 26, 2008; 5 pages.
Written Opinion of the International Searching Authority for International Application No. PCT/US13/32339 dated May 30, 2013; 7 pages.
Written Opinion of the International Searching Authority for International Application No. PCT/US13/48876 dated Jul. 26, 2013; 3 pages.
Written Opinion of the International Searching Authority for International Application No. PCT/US2012/21583 dated May 8, 2012; 4 pages.
Written Opinion of the International Searching Authority for International Application No. PCT/US2013/048885 dated Nov. 14, 2013; 7 pages.
Wu et al., "SONOS Device with Tapered Bandgap Nitride Layer," IEEE Transactions on Electron Devices, May 2005, vol. 52, No. 5, pp. 987-992; 6 pages.
Yang et al., "Reliability considerations in scaled SONOS nonvolatile memory devices, solid state Electronics", 43(1999) 2025-2032.
Japanese Office Action for Japanese Application No. 2016-123646 dated Jun. 13, 2017; 7 pages.
SIPO Office Action for International Application No. 2013800168932 dated Apr. 21, 2017; 7 pages.
USPTO Non-Final Rejection for U.S. Appl. No. 15/335,180 dated May 17, 2017; 81 pages.
"MAX 9000 Programmable Logic Device Family," Altera, Jul. 1999, Version 6.01, pp. 1-40; 41 pages.
L. Richard Carley, "Trimming Analog Circuits Using Floating-Gate Analog MOS Memory," IEEE Journal of Solid-State Circuits, vol. 24, No. 6, Dec. 1989, pp. 1569-1575; 7 pages.
"1.8V, 500-MHz, 10-Output JEDEC-Compliant Zero Delay Buffer," Cypress Advance Information, Feb. 12, 2004; 9 pages.
"10 Gigabit Ethernet Technology Overview White Paper", Revision 1.0, Retrieved from Internet: URL: http://www.10gea.org, May 2001.
"16K x 8/9 Dual-Port Static RAM with Sem, Int, Busy," Cypress Semiconductor Data Book, May 1995, CY7C006 and CY7C016, pp. 6:1-17; 10 pages.

(56) References Cited

OTHER PUBLICATIONS

"1K x 8 Dual-Port Static RAM," Cypress Semiconductor Data Book, May 1995, CY7C130/CY7C131 and CY7C140/C7C141, pp. 6:37-49; 8 pages.
"1 kHz to 30MHz Resistor Set SOT-23 Oscillator", Initial Release Final Electrical Specifications LTC1799, Linear Technology Corporation, Jan. 2001, pp. 1-4.
"200-MBaud HOTLink Transceiver," Cypress Semiconductor Corporation, Revised Feb. 13, 2004, CY7C924ADX, Document #38-02008 Rev. *D; 62 pages.
"2K x 16 Dual-Port Static RAM," Cypress Semiconductor Data Book, May 1995, CY7C133 and CY7C143, pp. 6:63-73; 7 pages.
"2K x 8 Dual-Port Static RAM," Cypress Semiconductor Data Book, May 1995, CY7C132/CY7C136 and CY7C142/CY7C146, pp. 6:50-62; 8 pages.
"3.3V 64K x 18 Synchronous QuadPort Static RAM," Cypress Preliminary CY7C0430BV, Cypress Semiconductor Corporation, Mar. 27, 2001; 36 pages.
"A Novel Integration Technology of EEPROM Embedded CMOS Logic VLSI Suitable for ASIC Applications", by Masataka Takebuchi et al., IEEE 1992 Custom Integrated Circuits Conference, pp. 9.6.1-9.6.4.
"A Novel Robust and Low Cost Stack Chips Package and Its Thermal Performance", by Soon-Jin Cho et al., IEEE Transaction on Advanced Packaging, vol. 23, No. 2, May 2000, pp. 257-265.
"A Planar Type EEPROM Cell Structure by Standard CMOS Process for Integration with Gate Array, Standard Cell, Microprocessor and for Neural Chips", by Katsuhiko Ohsaki et al., IEEE 1993 Custom Integrated Circuits Conference, pp-23.6.1-23.6A.
"A Single Chip Sensor & Image Processor for Fingerprint Verification" Anderson, S., et al., IEEE Custom Integrated Circuits Conference, May 12-15, 1991.
"A Single Poly EPROM for Custom CMOS Logic Applications", by Reza Kazerounian et al., IEEE 1986 Custom Integrated Circuits Conference, pp. 59-62.
"A Wide-Bandwidth Low-Voltage PLL for PowerPC.TM. Microprocessors", by Jose Alvarez et al., IEEE Journal of Solid-State Circuits, vol. 30, No. 4, Apr. 1995, pp. 383-391.
"About SMaL Camera Technologies, Inc.", SMaL Camera Technologies, 2001, 1 page.
"Achieving Uniform nMOS Device Power Distribution for Submicron ESD Reliability;" Charvaka Duvvuy, Carlos Diaz, and Tim Haddock; 1992; 92-131 through 92-134, no month.
"ADNS-2030 High Performance, Low Power Optical Mouse Sensor (Optimized for Cordless Mouse Applications)," Agilent Technologies, downloaded Oct. 10, 2005, <http://www.home.agilent.com/USeng/nav/-536893734,536883737/pd.html; 2 pages.
"ADNS-2051 High-Performance Optical Mouse Sensor," Agilent Technologies, downloaded Oct. 10, 2005, <http://www.home.agilent.com/USeng/nav/-536893734,536883737/pd.html>; 2 pages.
"Agilent ADNK-2030 Solid-State Optical Mouse Sensor," Agilent Technologies Inc., Sample Kit, 2003; 1 page.
"Agilent ADNS-2030 Low Power Optical Mouse Sensor," Agilent Technologies Inc., Data Sheet, 2005; 34 pages.
"Agilent ADNS-2051 Optical Mouse Sensor," Agilent Technologies Inc., Product Overview, 2003; 2 pages.
"Agilent Optical Mouse Sensors," Agilent Technologies Inc., Selection Guide, 2004; 3 pages.
"Algorithm for Managing Multiple First-In, First-Out Queues from a Single Shared Random-Access Memory," IBM Technical Disclosure Bulletin, Aug. 1989; 5 pages.
"Am99C10A 256.times.48 Content Addressable Memory", Advanced Micro Devices, Dec. 1992.
"An Analog PPL-Based Clock and Data Recovery Circuit with High Input Jitter Tolerance;" Sun, Reprinted from IEEE Journal of Solid-State Circuits, 1989; 4 pages.
"An EEPROM for Microprocessors and Custom Logic", by Roger Cuppens et al., IEEE Journal of Solid-State Circuits, vol. SC-20, No. 2, Apr. 1985, pp. 603-608.

"An EPROM Cell Structure foe EPLDs Compatible with Single Poly Gate Process", By Kuniyushi Yoshikawa et al., Extended Abstracts of the 18th (1986 International) Conference on Solid State Devices and Materials, Tokyo, 1986, pp. 323-326.
"An Experimental 5-V-Only 256-kbit CMOS EEPROM with a High-Performance Single-Polysilicon Cell", by Jun-Ichi Miyamoto et al., IEEE Journal of Solid State Circuits, vol. SC-21, No. 5, Oct. 1986, pp. 852-860.
U.S. Appl. No. 13/436,872: "Oxide-Nitride-Oxide Stack Having Multiple Oxynitride Layers" Sagy Levy, Zichron-Yoakev et al., filed Mar. 31, 2012; 53 pages.
U.S. Appl. No. 13/620,071: "Method of Fabricating a Nonvolatile Charge Trap Memory Device" Krishnaswamy Ramkumar et al., filed Sep. 14, 2012; 69 pages.
U.S. Appl. No. 14/172,775: "Oxide-Nitride-Oxide Stack Having Multiple Dxynitride Layers," Sagy Charel Levy et al., filed Feb. 4, 2014; 33 pages.
Shen et al., "Performance Improvement of SONOS Memory by Bandgap Engineering of Charge-Trapping Layer," IEEE Electron Device Letters, Apr. 2004, vol. 25, No. 4, pp. 205-207; 3 pages.
Chinese Office Action for Application No. 200880000820.3 dated Jan. 26, 2011; 6 pages.
Claims Last Amended for U.S. Appl. No. 13/007,533 dated Jun. 12, 2012; 7 pages.
European Search Report for European Application No. 13767422.2 dated Mar. 30, 2017; 6 pages.
European Search Report for European Application No. 13767422.2 dated Oct. 20, 2015; 5 pages.
Hua-Ching Chien, Chin-Hsing Kao, Jui-Wen Chang and Tzung-Kuen Tsai Two-bit SONOS type Flash using a band engineering in the nitride layer_Dated Jun. 17, 2005_4 pages.
Hung et al., High-performance gate-all-around polycrystalline silicon nanowire with silicon nanocrystals nonvolatile memory, Appl. Phys. Lett, 98 162108 (2011), pub date: Apr. 22, 2011.
International Search Report for International Application No. PCT/US08/06627 dated Aug. 26, 2008; 2 pages.
International Search Report for International Application No. PCT/US12/021583 dated May 8, 2012; 2 pages.
International Search Report for International Application No. PCT/US13/32339 dated May 30, 2013; 2 pages.
International Search Report for International Application No. PCT/US13/48876 dated Jul. 26, 2013; 5 pages.
International Search Report for International Application No. PCT/US13/48885 dated Nov. 14, 2013; 2 pages.
Japanese Office Action for Japanese Application No. 2013-549612 dated Aug. 4, 2015; 8 pages.
Japanese Office Action for Japanese Application No. 2015-503338 dated Feb. 21, 2017; 21 pages.
Krishnaswamy Ramkumar_Cypress SONOS Technology_Dated Jul. 6, 2011_9 pages.
Lue et al., "BE-SONOS: A Bandgap Engineered SONOS with Excellent Performance and Reliability," IEEE, 2005; 4 pages.
USPTO Non-Final Rejection for U.S. Appl. No. 12/152,518 dated Sep. 29, 2010; 5 pages.
USPTO Non-Final Rejection for U.S. Appl. No. 12/197,466 dated Jun. 1, 2011; 11 pages.
USPTO Non-Final Rejection for U.S. Appl. No. 13/288,919 dated Jun. 19, 2014; 5 pages.
USPTO Non-Final Rejection for U.S. Appl. No. 13/288,919 dated Dec. 5, 2013; 4 pages.
USPTO Non-Final Rejection for U.S. Appl. No. 13/436,872 dated Dec. 19, 2014; 15 pages.
USPTO Non-Final Rejection for U.S. Appl. No. 13/539,466 dated Sep. 28, 2012; 9 pages.
USPTO Non-Final Rejection for U.S. Appl. No. 13/917,500 dated Jan. 5, 2015; 13 pages.
USPTO Non-Final Rejection for U.S. Appl. No. 14/159,315 dated Oct. 21, 2014; 12 pages.
USPTO Non-Final Rejection for U.S. Appl. No. 14/172,775 dated Jun. 22, 2015; 14 pages.
USPTO Non-Final Rejection for U.S. Appl. No. 14/307,858 dated Jun. 29, 2015; 5 pages.

(56) References Cited

OTHER PUBLICATIONS

USPTO Non-Final Rejection for U.S. Appl. No. 14/605,231 dated Jul. 7, 2015; 13 pages.
USPTO Notice of Allowance for U.S. Appl. No. 12/124,855 dated May 1, 2012; 7 pages.
USPTO Notice of Allowance for U.S. Appl. No. 12/124,855 dated May 3, 2011; 7 pages.
USPTO Notice of Allowance for U.S. Appl. No. 12/124,855 dated Jul. 28, 2010; 6 pages.
USPTO Notice of Allowance for U.S. Appl. No. 12/124,855 dated Aug. 1, 2012; 7 pages.
USPTO Notice of Allowance for U.S. Appl. No. 12/152,518 dated Jul. 14, 2011; 6 pages.
USPTO Notice of Allowance for U.S. Appl. No. 12/197,466 dated Jun. 15, 2012; 4 pages.
USPTO Notice of Allowance for U.S. Appl. No. 12/197,466 dated Sep. 24, 2012; 8 pages.
USPTO Notice of Allowance for U.S. Appl. No. 13/007,533 dated Mar. 7, 2013; 8 pages.
USPTO Notice of Allowance for U.S. Appl. No. 13/007,533 dated Jun. 18, 2013; 9 pages.
USPTO Notice of Allowance for U.S. Appl. No. 13/007,533 dated Sep. 6, 2013; 9 pages.
USPTO Notice of Allowance for U.S. Appl. No. 13/007,533 dated Nov. 27, 2012; 13 pages.
USPTO Notice of Allowance for U.S. Appl. No. 13/007,533 dated Dec. 6, 2013; 10 pages.
USPTO Notice of Allowance for U.S. Appl. No. 13/288,919 dated Apr. 28, 2014; 5 pages.
USPTO Notice of Allowance for U.S. Appl. No. 13/288,919 dated Jul. 8, 2014; 5 pages.
USPTO Notice of Allowance for U.S. Appl. No. 13/288,919 dated Aug. 26, 2014; 7 pages.
USPTO Notice of Allowance for U.S. Appl. No. 13/436,872 dated Jan. 15, 2016; 5 pages.
USPTO Notice of Allowance for U.S. Appl. No. 13/436,872 dated Sep. 15, 2015; 9 pages.
USPTO Notice of Allowance for U.S. Appl. No. 13/436,875; dated Apr. 22, 2016; 8 pages.
USPTO Notice of Allowance for U.S. Appl. No. 13/539,458 dated May 24, 2013; 8 pages.
USPTO Notice of Allowance for U.S. Appl. No. 13/539,458 dated Aug. 4, 2014; 7 pages.
USPTO Notice of Allowance for U.S. Appl. No. 13/539,458 dated Nov. 3, 2014; 7 pages.
USPTO Notice of Allowance for U.S. Appl. No. 13/539,466 dated Sep. 4, 2013; 9 pages.
USPTO Notice of Allowance for U.S. Appl. No. 13/539,466 dated Nov. 13, 2013; 9 pages.
USPTO Notice of Allowance for U.S. Appl. No. 13/539,466 dated Nov. 27, 2012; 8 pages.
USPTO Notice of Allowance for U.S. Appl. No. 13/620,071 dated Jan. 23, 2015; 5 pages.
USPTO Notice of Allowance for U.S. Appl. No. 13/620,071 dated Oct. 27, 2014; 7 pages.
USPTO Notice of Allowance for U.S. Appl. No. 13/917,500 dated Jun. 1, 2015; 6 pages.
USPTO Notice of Allowance for U.S. Appl. No. 13/917,500 dated Sep. 14, 2015; 5 pages.
USPTO Notice of Allowance for U.S. Appl. No. 13/917,500 dated Dec. 31, 2015; 5 pages.
USPTO Notice of Allowance for U.S. Appl. No. 14/159,315 dated Feb. 18, 2015; 9 pages.
USPTO Notice of Allowance for U.S. Appl. No. 14/159,315 dated Mar. 23, 2015; 9 pages.
USPTO Notice of Allowance for U.S. Appl. No. 14/172,775 dated Sep. 4, 2015; 7 pages.
USPTO Notice of Allowance for U.S. Appl. No. 14/172,775 dated Dec. 18, 2015; 6 pages.
USPTO to Notice of Allowance for U.S. Appl. No. 14/307,858 dated Nov. 27, 2015; 5 pages.
USPTO Notice of Allowance for U.S. Appl. No. 14/811,346 dated Jul. 19, 2016; 7 pages.
USPTO Notice of Allowance for U.S. Appl. No. 13/436,872 dated May 11, 2016; 5 pages.
USPTO Requirement for Restriction for U.S. Appl. No. 12/152,518 dated Jun. 9, 2010; 5 pages.
USPTO Requirement for Restriction for U.S. Appl. No. 13/007,533 dated Dec. 6, 2011; 7 pages.
USPTO Requirement for Restriction for U.S. Appl. No. 14/307,858 dated May 18, 2015; 7 pages.
SIPO Office Action for Application No. 20120000107.5 dated Sep. 20, 2017; 12 pages.
SIPO Office Action for Application No. 201380031840.8 dated Sep. 25, 2017; 15 pages.
USPTO Non-Final Rejection for U.S. Appl. No. 15/099,025 dated Oct. 6, 2017; 91 pages.
USPTO Non-Final Rejection for U.S. Appl. No. 15/189,668 dated Sep. 22, 2017; 96 pages.
USPTO Notice of Allowance for U.S. Appl. No. 14/605,231 dated Oct. 18, 2017; 8 pages.
USPTO Notice of Allowance for U.S. Appl. No. 15/335,180 dated Oct. 4, 2017; 21 pages.
USPTO Final Rejection for U.S. Appl. No. 15/099,025 dated Apr. 30, 2018; 12 pages.
USPTO Notice of Allowance for U.S. Appl. No. 14/605,231 dated Feb. 23, 2018; 8 pages.
USPTO Notice of Allowance for U.S. Appl. No. 15/189,668 dated Feb. 13, 2018; 12 pages.
SIPO Office Action for Chinese Application No. 2013800168932 dated Jul. 4, 2018; 7 pages.
SIPO Office Action for Chinese Application No. 2013800319699 dated Aug. 20, 2018; 7 pages.
USPTO Non-Final Rejection for U.S. Appl. No. 15/864,832 dated May 15, 2018; 17 pages.
European Summons Oral Proceedings for European Application No. 13767422.2 dated May 23, 2018; 10 pages.
TIPO Office Action for Taiwan Patent Application No. 106121057 dated Jun. 1, 2018; 3 pages.
USPTO Non-Final Rejection for U.S. Appl. No. 15/099,025 dated Dec. 31, 2018, 9 pages.
USPTO Notice of Allowance for U.S. Appl. No. 14/605,231 dated Nov. 16, 2018, 7 pages.
USPTO Notice of Allowance for U.S. Appl. No. 15/864,832 dated Jan. 18, 2019, 8 pages.
USPTO Final Rejection for U.S. Appl. No. 15/864,832 dated Nov. 1, 2018, 23 pages.
Korean Intellectual Property Office Office Action for international application No. 10-2014-7025059 dated Mar. 29, 2019, 5 pages.
SIPO Office Action for International Application No. 2016109914026 dated Jan. 24, 2019, 4 pages.
USPTO Notice of Allowance for U.S. Appl. No. 15/189,668 dated Mar. 21, 2019, 7 pages.
KIPO Office Action for International Application No. 10-2012-7008106 dated Oct. 5, 2018; 3 pages.
Japanese Office Action for Japanese Application No. 2015-503338 dated Jan. 15, 2019; 11 pages.
KIPO Office Action for International Application No. 10-2012-7008106 dated Jan. 29, 2019; 3 pages.
SIPO Office Action for Chinese Application No. 2013800319699 dated May 31, 2017; 17 pages.
TIPO Office Action for Taiwan Application No. 106107213 dated Jul. 4, 2017; 12 pages.
USPTO Final Rejection for U.S. Appl. No. 14/605,231 dated Jul. 10, 2017; 8 pages.

* cited by examiner

MEMORY TRANSISTOR WITH MULTIPLE CHARGE STORING LAYERS AND A HIGH WORK FUNCTION GATE ELECTRODE

CROSS-REFERENCE TO RELATED APPLICATIONS

The present application is a continuation of and claims the benefit of priority under 35 U.S.C. 119(e) to U.S. Non-Provisional application 15/335,180, which is a continuation of U.S. patent application Ser. No. 14/811,346, filed Jul. 28, 2015, now U.S. Pat. No. 9,502,543, issued on Nov. 22, 2016, which is a continuation of U.S. patent application Ser. No. 14/159,315, filed on Jan. 20, 2014, now U.S. Pat. No. 9,093,318, issued on Jul. 28, 2015 which is a continuation of U.S. patent application Ser. No. 13/539,466, filed on Jul. 1, 2012, now U.S. Pat. No. 8,633,537, issued on Jan. 21, 2014, which is a continuation-in-part of patent application Ser. No. 13/288,919, filed Nov. 3, 2011, now U.S. Pat. No. 8,859,374, issued on Oct. 14, 2014, which is a divisional of U.S. Pat. No. 12/152,518, filed May 13, 2008, now U.S. Pat. No. 8,063,434, issued Nov. 22, 2011, which claims the benefit of priority to U.S. Provisional Patent Application No. 60/940,160, filed May 25, 2007, all of which application are hereby incorporated by reference in their entirety.

TECHNICAL FIELD

The present invention relates generally to semiconductor devices, and more particularly to integrated circuits including non-volatile semiconductor memories and methods of fabricating the same.

BACKGROUND OF THE INVENTION

Non-volatile semiconductor memories are devices that can be electrically erased and reprogrammed. One type of non-volatile memory that is widely used for general storage and transfer of data in and between computers and other electronic devices is flash memory, such as a split gate flash memory. A split gate flash memory transistor has an architecture similar to that of a conventional logic transistor, such as Metal-Oxide-Semiconductor Field Effect Transistor (MOSFET), in that it also includes a control gate formed over a channel connecting a source and drain in a substrate. However, the memory transistor further includes a memory or charge trapping layer between the control gate and the channel and insulated from both by insulating or dielectric layers. A programming voltage applied to the control gate traps a charge on the charge trapping layer, partially canceling or screening an electric field from the control gate, thereby changing a threshold voltage ($V_T$) of the transistor and programming the memory cell. During read-out, this shift in $V_T$ is sensed by the presence or absence of current flow through the channel with application of a predetermined read-out voltage. To erase the memory transistor, an erase voltage is applied to the control gate to restore, or reverse the shift in $V_T$.

An important measure of merit for flash memories is data retention time, which is the time for which the memory transistor can hold charge or remain programmed without the application of power. The charge stored or trapped in the charge trapping layer decreases over time due to leakage current through the insulating layers, thereby reducing the difference between a programmed threshold voltage (VTP) and an erased threshold voltage (VTE) limiting data retention of the memory transistor.

One problem with conventional memory transistors and methods of forming the same is that the charge trapping layer typically has poor or decreasing data retention over time, limiting the useful transistor lifetime. Referring to FIG. 1A, if the charge trapping layer is silicon (Si) rich there is a large, initial window or difference between VTP, represented by graph or line 102, and the VTE, represented by line 104, but the window collapse very rapidly in retention mode to an end of life (EOL 106) of less than about 1.E+07 seconds.

Referring to FIG. 1B, if on the other hand the charge trapping layer is if a high quality nitride layer, that is one having a low stoichiometric concentration of Si, the rate of collapse of the window or Vt slope in retention mode is reduced, but the initial program-erase window is also reduced. Moreover, the slope of Vt in retention mode is still appreciably steep and the leakage path is not sufficiently minimized to significantly improve data retention, thus EOL 106 is only moderately improved.

Another problem is that increasingly semiconductor memories combine logic transistors, such as MOSFET's, with memory transistors in integrated circuits (ICs) fabricated on a common substrate for embedded memory or System-On-Chip (SOC) applications. Many of the current processes for forming performance of memory transistors are incompatible with those used for fabricating logic transistors.

Accordingly, there is a need for memory transistors and methods of forming the same that provides improved data retention and increased transistor lifetime. It is further desirable that the methods of forming the memory device are compatible with those for forming logic elements in the same IC formed on a common substrate.

SUMMARY OF THE INVENTION

The present invention provides a solution to these and other problems, and offers further advantages over conventional memory transistors or devices and methods of forming the same.

In a first aspect, the present invention is directed to a non-volatile memory transistor including: (i) an oxide-nitride-oxide (ONO) dielectric stack on a surface of a semiconductor substrate; and (ii) high work function gate electrode formed over a surface of the ONO dielectric stack. Preferably, the high work function gate electrode comprises a doped polycrystalline silicon or polysilicon (poly) layer. More preferably, the doped polysilicon layer comprises a P+ dopant, such as boron or difluoroborane ($BF_2$), and the substrate comprises a silicon surface on which the ONO dielectric stack is formed to form a silicon-oxide-nitride-oxide-silicon (SONOS) gate stack of a NMOS SONOS memory transistor.

In certain embodiments, the ONO dielectric stack comprises a multi-layer charge storage layer including at least a substantially trap free bottom oxynitride layer and a charge trapping top oxynitride layer. In one version of these embodiments, for example, the top oxynitride layer is formed under conditions selected to form a silicon-rich, oxygen-lean oxynitride layer, and the bottom oxynitride layer is formed under conditions selected to form a silicon-rich, oxygen-rich oxynitride layer.

In another aspect, the present invention is directed to a semiconductor device including both a non-volatile memory transistor and a metal oxide semiconductor (MOS) logic transistor and methods of forming the same. The memory transistor includes an ONO dielectric stack including a multi-layer charge storage layer formed on a surface of a semiconductor substrate, and a high work function gate electrode formed over a surface of the ONO dielectric stack. Preferably, the high work function gate electrode of the memory transistor comprises a doped polysilicon layer. More preferably, the MOS logic transistor also includes a high work function gate electrode formed over a gate oxide on the surface of the substrate.

In one embodiment, the high work function gate electrodes of the memory transistor and the MOS logic transistor comprise a P+ doped polysilicon layer deposited over the ONO stack and gate oxide on a silicon substrate to form an NMOS SONOS memory transistor and a P-type (PMOS) logic transistor. The multi-layer charge storing layer can include, for example, a substantially trap free bottom oxynitride layer and a charge trapping top oxynitride layer.

In one embodiment, a method of forming such a semiconductor device comprises steps of: (i) forming an ONO dielectric stack on a surface of a semiconductor substrate in at least a first region in which a non-volatile memory transistor is to be formed, the ONO dielectric stack including a multi-layer charge storage layer; (ii) forming an oxide layer on the surface of the substrate in a second region in which a MOS logic transistor is to be formed; and (iii) forming a high work function gate electrode on a surface of the ONO dielectric stack. Preferably, the step of forming a high work function gate electrode on a surface of the ONO dielectric stack comprises the step of forming a doped polysilicon layer on a surface of the ONO dielectric stack. More preferably, the step of forming a doped polysilicon layer on a surface of the ONO dielectric stack further comprises the step of also forming the doped polysilicon layer on a surface of the oxide layer of the MOS logic transistor form a high work function gate electrode thereon.

In certain embodiments, the semiconductor substrate includes a silicon surface over which the ONO dielectric stack is formed, and the step of forming a doped polysilicon layer comprises the step of forming a P+ doped polysilicon layer to form an NMOS SONOS memory transistor and a PMOS logic transistor. Generally, the polysilicon layer can be doped by ion implantation with boron or $BF_2$, before or after patterning the polysilicon layer, the ONO dielectric stack and the oxide layer to form gate stacks of the memory transistor and the MOS logic transistor.

In other embodiments, the step of forming the ONO dielectric stack comprises the step of forming a multi-layer charge storage layer overlying a lower or tunnel oxide layer on the surface of the substrate, followed depositing or growing an upper or blocking oxide layer over the multi-layer charge storage layer. Preferably, the step of forming the multi-layer charge storage layer comprises the step of forming a substantially trap free bottom oxynitride layer followed by forming a charge trapping top oxynitride layer overlying the trap free bottom oxynitride layer. More preferably, the bottom oxynitride layer is formed under conditions selected to form a silicon-rich, oxygen-rich oxynitride layer, and the top oxynitride layer is formed under conditions selected to form a silicon-rich, oxygen-lean oxynitride layer. Optionally, the charge trapping top oxynitride layer formed, for example, in a chemical vapor deposition (CVD) process using a process gas comprising Bis-TertiaryButylAminoSilane (BTBAS) selected to increase a concentration of carbon and thereby the number of traps therein.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

Figure 1A:
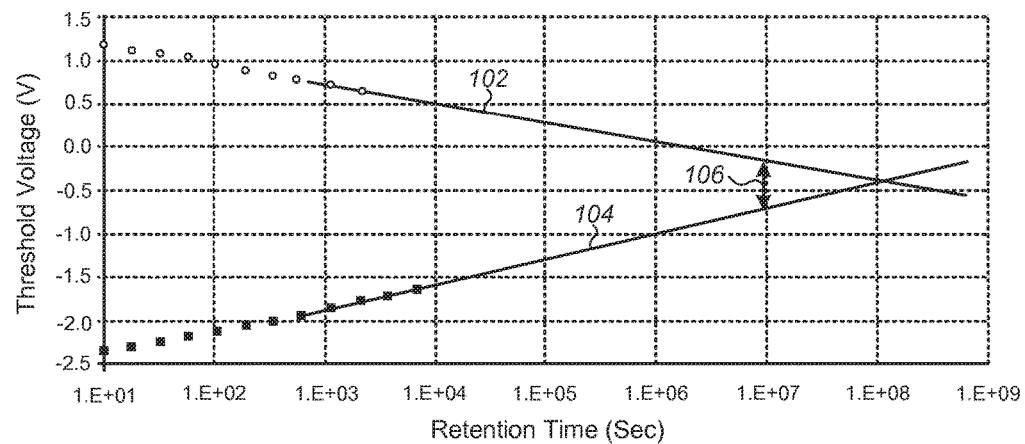
FIG. 1A is a graph showing data retention for a memory transistor using a charge storage layer formed according to a conventional method and having a large initial difference between programming and erase voltages but which loses charge quickly.
Figure 1B:
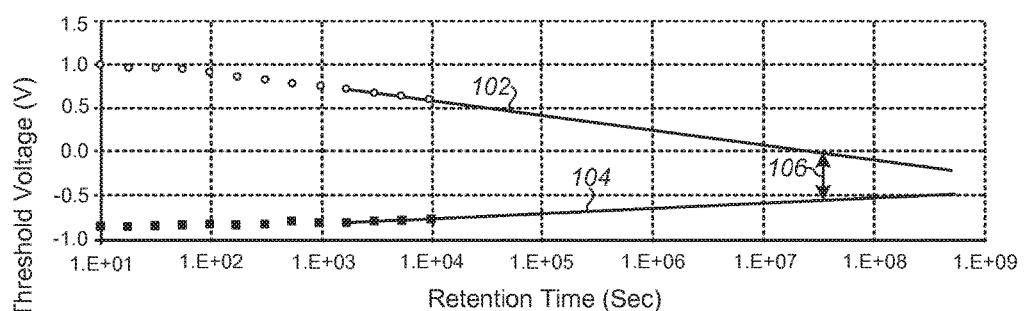
FIG. 1B is a graph showing data retention for a memory transistor using a charge storage layer formed according to a conventional method and having a smaller initial difference between programming and erase voltages.

The present invention is directed generally to non-volatile memory transistor including a multi-layer charge storage layer and high work function gate electrode to increase data retention and/or to improve programming time and efficiency. The structure and method are particularly useful for embedded memory or System-On-Chip (SOC) applications in which a semiconductor device includes both a logic transistor and non-volatile memory transistor comprising high work function gate electrodes formed on a common substrate.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly connect and to indirectly connect through one or more intervening components.

Briefly, a non-volatile memory transistor according to the present invention includes a high work function gate electrode formed over an oxide-nitride-oxide (ONO) dielectric stack. By high work function gate electrode it is meant that the minimum energy needed to remove an electron from the gate electrode is increased.

In certain preferred embodiments, the high work function gate electrode comprises a doped polycrystalline silicon or polysilicon (poly) layer, the fabrication of which can be can be readily integrated into standard complementary metal-oxide-semiconductor (CMOS) process flows, such as those used fabricate metal-oxide-semiconductor (MOS) logic transistors, to enable fabrication of semiconductor memories or devices including both memory and logic transistors.

More preferably, the same doped polysilicon layer can also be patterned to form a high work function gate electrode for the MOS logic transistor, thereby improving the performance of the logic transistor and increasing the efficiency of the fabrication process. Optionally, the ONO dielectric stack includes a multi-layer charge storage or charge trapping layer to further improve performance, and in particular data retention, of the memory transistor.

A semiconductor device including a non-volatile memory transistor comprising a high work function gate electrode and methods of forming the same will now be described in detail with reference to FIGS. 2A through 2D, which are partial cross-sectional side views of intermediate structures illustrating a process flow for forming a semiconductor device including both memory and logic transistors. For purposes of clarity, many of the details of semiconductor fabrication that are widely known and are not relevant to the present invention have been omitted from the following description.

Referring to FIG. 2, fabrication of the semiconductor device begins with formation of an ONO dielectric stack 202 over a surface 204 of a wafer or substrate 206. Generally, the ONO dielectric stack 202 includes a thin, lower oxide layer or tunneling oxide layer 208 that separates or electrically isolates a charge trapping or storage layer 210 from a channel region (not shown) of the memory transistor in the substrate 206, and a top or blocking oxide layer 212. Preferably, as noted above and as shown in FIGS. 2A-2D, the charge storage layer 210 is a multi-layer charge storage layer including at least a top, charge trapping oxynitride layer 210A and a lower, substantially trap free oxynitride layer 210B.

Generally, the substrate 206 may include any known silicon-based semiconductor material including silicon, silicon-germanium, silicon-on-insulator, or silicon-on-sapphire substrate. Alternatively, the substrate 206 may include a silicon layer formed on a non-silicon-based semiconductor material, such as gallium-arsenide, germanium, gallium-nitride, or aluminum-phosphide. Preferably, the substrate 206 is a doped or undoped silicon substrate.

The lower oxide layer or tunneling oxide layer 208 of the ONO dielectric stack 202 generally includes a relatively thin layer of silicon dioxide ($SiO_2$) of from about 15 angstrom (Å) to about 22 Å, and more preferably about 18 Å. The tunneling oxide layer 208 can be formed or deposited by any suitable means including, for example, being thermally grown or deposited using chemical vapor deposition (CVD). In a preferred embodiment, the tunnel oxide layer is formed or grown using a steam anneal. Generally, the process includes a wet-oxidizing method in which the substrate 206 is placed in a deposition or processing chamber, heated to a temperature from about 700° C. to about 850° C., and exposed to a wet vapor for a predetermined period of time selected based on a desired thickness of the finished tunneling oxide layer 208. Exemplary process times are from about 5 to about 20 minutes. The oxidation can be performed at atmospheric or at low pressure.

In a preferred embodiment, the oxynitride layers 210A, 210B, of the multi-layer charge storage layer 210 are formed or deposited in separate steps utilizing different processes and process gases or source materials, and have an overall or combined thickness of from about 70 Å to about 150 Å, and more preferably about 100 Å. The lower, trap free oxynitride layer 210B can be formed or deposited by any suitable means including, for example, deposition in a low pressure CVD process using a process gas including a silicon source, such as silane ($SiH_4$), chlorosilane ($SiH_3Cl$), dichlorosilane ($SiH_2Cl_2$), tetrachlorosilane ($SiCl_4$), a nitrogen source, such as nitrogen ($N_2$), ammonia ($NH_3$), nitrogen trioxide ($NO_3$) or nitrous oxide ($N_2O$), and an oxygen-containing gas, such as oxygen ($O_2$) or $N_2O$. In one embodiment the trap free oxynitride layer 210B is deposited in a low pressure CVD process using a process gas including dichlorosilane, $NH_3$ and $N_2O$, while maintaining the chamber at a pressure of from about 5 millitorr (mT) to about 500 mT, and maintaining the substrate at a temperature of from about 700° C. to about 850° C. and more preferably at least about 780° C., for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 200 standard cubic centimeters per minute (sccm).

The top, charge trapping oxynitride layer 210A can be deposited over the bottom oxynitride layer 210B in a CVD process using a process gas including Bis-TertiaryButylAminoSilane (BTBAS). It has been found that the use of BTBAS increases the number of deep traps formed in the oxynitride by increasing the carbon level in the charge trapping oxynitride layer 210A. Moreover, these deep traps reduce charge losses due to thermal emission, thereby further improving data retention. More preferably, the process gas includes BTBAS and ammonia ($NH_3$) mixed at a predetermined ratio to provide a narrow band gap energy level in the oxynitride charge trapping layer. In particular, the process gas can include BTBAS and $NH_3$ mixed in a ratio of from about 7:1 to about 1:7. For example, in one embodiment the charge trapping oxynitride layer 210A is deposited in a low pressure CVD process using BTBAS and ammonia $NH_3$ at a chamber pressure of from about 5 mT to about 500 mT, and at a substrate temperature of from about 700° C. to about 850° C. and more preferably at least about 780° C., for a period of from about 2.5 minutes to about 20 minutes.

It has been found that an oxynitride layer produced or deposited under the above conditions yields a trap-rich oxynitride layer 210A, which improves the program and erase speed and increases of the initial difference (window) between program and erase voltages without compromising a charge loss rate of the memory transistor, thereby extending the operating life (EOL) of the device. Preferably, the charge trapping oxynitride layer 210A has a charge trap density of at least about $1E10/cm^2$, and more preferably from about $1E12/cm^2$ to about $1E14/cm^2$.

Alternatively, the charge trapping oxynitride layer 210A can be deposited over the bottom oxynitride layer 210B in a CVD process using a process gas including BTBAS and substantially not including ammonia ($NH_3$). In this alternative embodiment of the method, the step of depositing the top, charge trapping oxynitride layer 210A is followed by a thermal annealing step in a nitrogen atmosphere including nitrous oxide ($N_2O$), $NH_3$, and/or nitrogen oxide (NO).

Preferably, the top, charge trapping oxynitride layer 210A is deposited sequentially in the same CVD tool used to form the bottom, trap free oxynitride layer 210B, substantially without breaking vacuum on the deposition chamber. More preferably, the charge trapping oxynitride layer 210A is deposited substantially without altering the temperature to which the substrate 206 was heated during deposition of the trap free oxynitride layer 210B.

A suitable thickness for the lower, trap free oxynitride layer 210B has been found to be from about 10 Å to about 80 Å, and a ratio of thicknesses between the bottom layer and the top, charge trapping oxynitride layer has been found to be from about 1:6 to about 6:1, and more preferably at least about 1:4.

The top oxide layer 212 of the ONO dielectric stack 202 includes a relatively thick layer of SiO$_2$ of from about 20 Å to about 70 Å, and more preferably about 45 Å. The top oxide layer 212 can be formed or deposited by any suitable means including, for example, being thermally grown or deposited using CVD. In a preferred embodiment, the top oxide layer 212 is a high-temperature-oxide (HTO) deposited using CVD process. Generally, the deposition process includes exposing the substrate 308 to a silicon source, such as silane, chlorosilane, or dichlorosilane, and an oxygen-containing gas, such as O$_2$ or N$_2$O in a deposition chamber at a pressure of from about 50 mT to about 1000 mT, for a period of from about 10 minutes to about 120 minutes while maintaining the substrate at a temperature of from about 650° C. to about 850° C.

Preferably, the top oxide layer 212 is deposited sequentially in the same tool used to form the oxynitride layers 210A, 210B. More preferably, the oxynitride layers 210A, 210B, and the top oxide layer 212 are formed or deposited in the same tool used to grow the tunneling oxide layer 208. Suitable tools include, for example, an ONO AVP, commercially available from AVIZA technology of Scotts Valley, Calif.

Figure 2A:
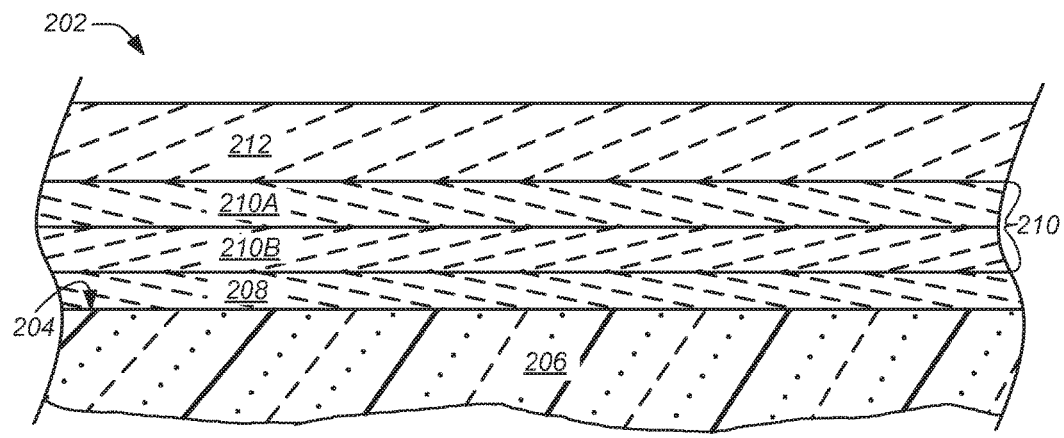
FIGS. 2A through 2D are partial cross-sectional side views of a semiconductor device illustrating a process flow for forming a semiconductor device including a logic transistor and non-volatile memory transistor according to an embodiment of the present invention.
Figure 2B:
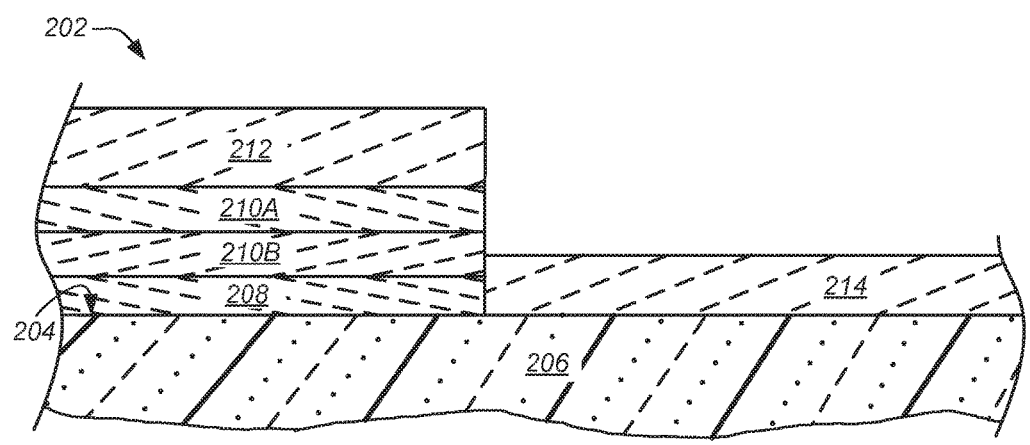

Referring to FIG. 2B, in those embodiments in which the semiconductor device is to further include a logic transistor, such as a MOS logic transistor, formed on the surface of the same substrate the ONO dielectric stack 202 is removed from a region or area of the surface 204 in which the logic transistor is to be formed, and an oxide layer 214 the formed thereon.

Generally, the ONO dielectric stack 202 is removed from the desired region or area of the surface 204 using standard photolithographic and oxide etch techniques. For example, in one embodiment a patterned mask layer (not shown) is formed from a photo-resist deposited on the ONO dielectric stack 202, and the exposed region etched or removed using a low pressure radiofrequency (RF) coupled or generated plasma comprising fluorinated hydrocarbon and/or fluorinated carbon compounds, such as C$_2$H$_2$F$_4$ commonly referred to as Freon®. Generally, the processing gas further includes argon (Ar) and nitrogen (N$_2$) at flow rates selected to maintain a pressure in the etch chamber of from about 50 mT to about 250 mT during processing.

The oxide layer 214 of the logic transistor can include a layer of SiO$_2$ having a thickness of from about 30 to about 70 Å, and can be thermally grown or deposited using CVD. In one embodiment, the oxide layer 214 is thermally grown using a steam oxidation process, for example, by maintaining the substrate 206 in a steam atmosphere at a temperature of from about 650° C. to about 850° C. for a period of from about 10 minutes to about 120 minutes.

Next, a doped polysilicon layer is formed on a surface of the ONO dielectric stack 202 and, preferably, the oxide layer 214 of the logic transistor. More preferably, the substrate 206 is a silicon substrate or has a silicon surface on which the ONO dielectric stack is formed to form a silicon-oxide-nitride-oxide-silicon (SONOS) gate stack of a SONOS memory transistor.

Figure 2C:
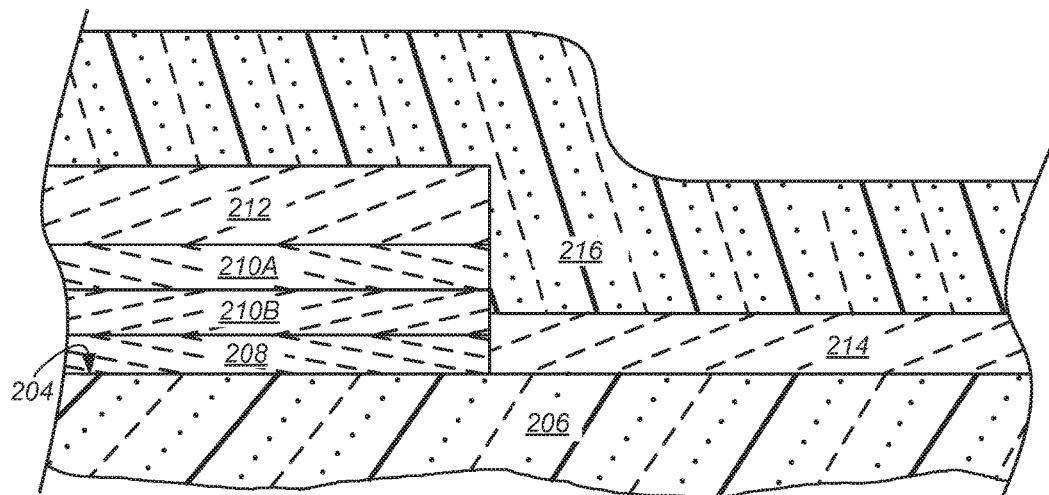

Referring to FIG. 2C, forming of the doped polysilicon layer begins with the deposition of a conformal polysilicon layer 216 having a thickness of from about 200 Å to about 2000 Å over the ONO dielectric stack 202 and the oxide layer 214. The polysilicon layer 216 can be formed or deposited by any suitable means including, for example, deposition in a low pressure CVD process using a silicon source or precursor. In one embodiment the polysilicon layer 216 is deposited in a low pressure CVD process using a silicon containing process gas, such as silane or dichlorosilane, and N$_2$, while maintaining the substrate 206 in a chamber at a pressure of from about 5 to 500 mT, and at a temperature of from about 600° C. to about 1000° C. for a period of from about 20 minutes to about 100 minutes to a substantially undoped polysilicon layer. The polysilicon layer 216 can be formed or grown directly as a doped polysilicon layer through the addition of gases such as phosphine, arsine, diborane or difluoroborane (BF$_2$) to the CVD chamber during the low pressure CVD process.

In one embodiment, the polysilicon layer 216 is doped following the growth or formation in the LPCVD process using ion implantation process. For example, the polysilicon layer 216 can be doped by implanting boron (B$^+$) or BF$_2$ ions at an energy of from about 5 to about 100 kilo-electron volts (keV), and a dose of from about 1e14 cm$^{-2}$ to about 1e16 cm$^{-2}$ to form an N-type (NMOS) SONOS memory transistor and, preferably, a P-type (PMOS) logic transistor having high work function gate electrodes. More preferably, the polysilicon layer 216 is doped to a concentration or dose selected so that the minimum energy needed to remove an electron from the gate electrode is from at least about 4.8 electron volts (eV) to about 5.3 eV.

Alternatively, the polysilicon layer 216 can be doped by ion implantation after patterning or etching the polysilicon layer and the underlying dielectric layers. It will be appreciated that this embodiment includes additional masking steps to protect exposed areas of the substrate 206 surface 204 and/or the dielectric layers from receiving undesired doping. However, generally such a masking step is included in existing process flows regardless of whether the implantation occurs before or after patterning.

Figure 2D:
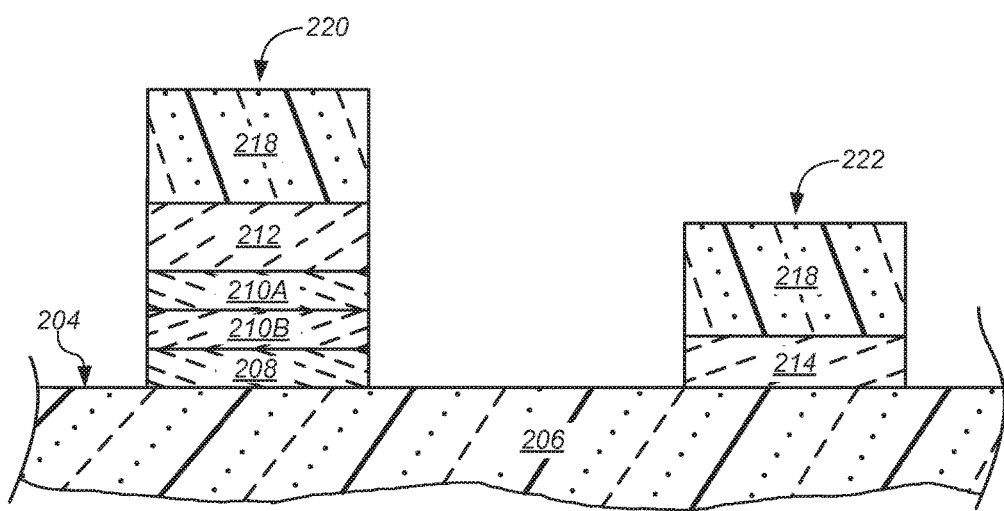

Referring to FIG. 2D, the polysilicon layer 216 and the underlying dielectric stack 202 and oxide layer 214 are patterned or etched to form high work function gate electrodes 218 of the memory transistor 220 and logic transistor 222. In one embodiment polysilicon layer 216 can be etched or patterned using a plasma comprising hydrobromic acid (HBr), chlorine (CL$_2$) and/or oxygen (O$_2$) at a pressure of about 25 mTorr, and a power of about 450 W. The oxide layers 208, 212, 214, and oxynitride layers 210A, 210B, can be etched using standard photolithographic and oxide etch techniques as described. For example, in one embodiment the patterned polysilicon layer 216 is used as a mask, and the exposed oxide layers 208, 212, 214, and oxynitride layers 210A, 210B, etched or removed using low pressure RF plasma. Generally, the plasma is formed from a processing gas comprising a fluorinated hydrocarbon and/or fluorinated carbon compounds, and further including Ar and N$_2$ at flow rates selected to maintain a pressure in the etch chamber of from about 50 mT to about 250 mT during processing.

Finally, the substrate is thermal annealed with a single or multiple annealing steps at a temperature of from about 800° C. to about 1050° C. for a time of from about 1 second to about 5 minutes to drive in ions implanted in the polysilicon layer 216, and to repair damage to the crystal structure of the polysilicon layer caused by ion implantation. Alternatively, advanced annealing techniques, such as flash and laser, can be employed with temperatures as high as 1350° C. and anneal times as low as 1 millisecond.

Figure 3:
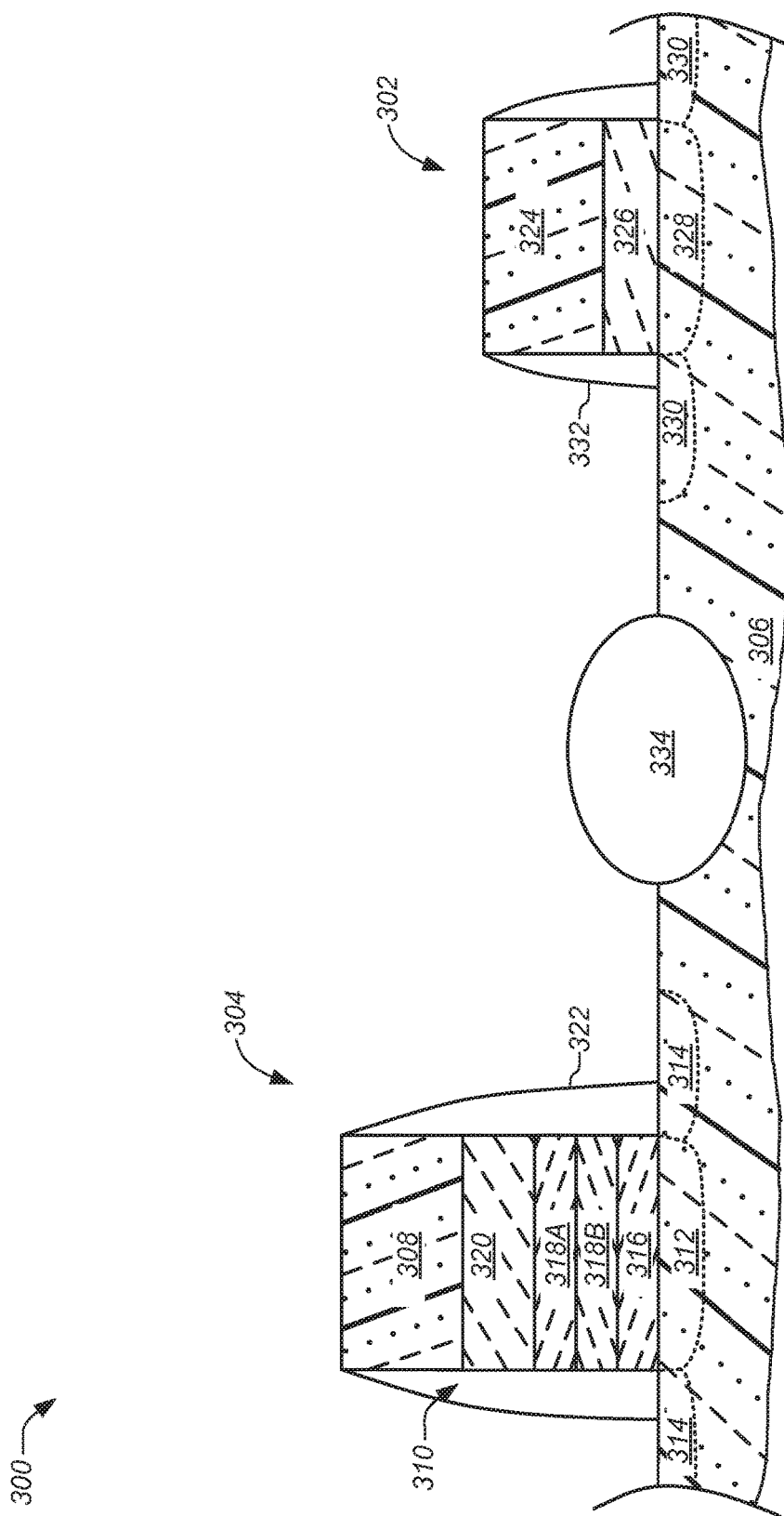
FIG. 3 is a partial cross-sectional side view of a semiconductor device including a logic transistor and non-volatile memory transistor comprising high work function gate electrodes according to an embodiment of the present invention.

A partial cross-sectional side view of a semiconductor device 300 including a logic transistor 302 and non-volatile memory transistor 304 comprising high work function gate electrodes according to an embodiment of the present invention is shown in FIG. 3. Referring to FIG. 3, the memory transistor 304 is formed on a silicon substrate 306 and comprises a high work function gate electrode 308 formed from a doped polysilicon layer overlying a dielectric stack 310. The dielectric stack 310 overlies and controls current through a channel region 312 separating heavily doped source and drain (S/D) regions 314. Preferably, the dielectric stack 310 includes a tunnel oxide 316, a multi-layer charge storage layer 318A, 318B, and a top or blocking oxide layer 320. More preferably, the multi-layer charge storage layer 318A, 318B, includes at least a top, charge trapping oxynitride layer 318A and a lower, substantially trap free oxynitride layer 318B. Optionally, as shown in FIG. 3, the memory transistor 304 further includes one or more sidewall spacers 322 surrounding the gate stack to electrically insulate it from contacts (not shown) to the S/D regions 320 and from other transistors in the semiconductor device formed on the substrate 306.

The logic transistor 302 comprises a gate electrode 324 overlying an oxide layer 326 formed over a channel region 328 separating heavily doped source and drain regions 330, and, optionally, can include one or more sidewall spacers 332 surrounding the gate electrically insulate it from contacts (not shown) to the S/D regions. Preferably, as shown in FIG. 3, the gate electrode 324 of the logic transistor 302 also comprises a high work function gate electrode formed from a doped polysilicon layer.

Generally, the semiconductor device 300 further includes a number of isolation structures 334, such as a local oxidation of silicon (LOCOS) region or structure, a field oxidation region or structure (FOX), or a shallow trench isolation (STI) structure to electrically isolate individual transistors formed on the substrate 306 from one another.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known

What is claimed is:
1. A semiconductor device comprising:
a non-volatile memory transistor comprising:
  a charge trapping layer comprising a silicon rich, oxygen-lean oxynitride,
  a tunnel dielectric disposed between the charge trapping layer and a substrate, and
  a blocking oxide disposed between the charge trapping layer and a first single-layer gate electrode;
a logic transistor comprising:
  a second single-layer gate electrode, and
  an oxide disposed between the second gate electrode and the substrate; and
an isolation structure disposed between the non-volatile memory transistor and the logic transistor,
wherein the first gate electrode has a first work function and the second gate electrode has a second work function, wherein the first work function is a high work function.

2. The semiconductor device of claim 1, wherein the blocking oxide is a high-temperature-oxide (HTO).

3. The semiconductor device of claim 1, further comprising:
first sidewall spacers formed adjacent to the non-volatile memory transistor; and
second sidewall spacers formed adjacent to the logic transistor.

4. The semiconductor device of claim 1, wherein the non-volatile memory transistor is an N-type transistor and wherein the logic transistor is a P-type transistor.

5. The semiconductor device of claim 1, wherein the first and second single-layer gate electrodes are formed from a doped polysilicon with doped concentration such that the minimum energy to remove an electron from the first and second single-layer gate electrodes is from approximately 4.8-5.3 electron volts (eV).

6. The semiconductor device of claim 1, wherein the isolation structure is one of a local oxidation silicon (LOCOS) region or structure, a field oxidation (FOX) region or structure, or a shallow trench isolation (STI) structure.

7. The semiconductor device of claim 1, wherein the charge trapping layer comprises:
a charge-trapping oxynitride layer; and
a substantially trap-free oxynitride layer disposed between the charge-trapping oxynitride layer and the tunnel dielectric.

8. The semiconductor device of claim 7, wherein the charge-trapping oxynitride layer has a first thickness and the substantially trap-free oxynitride layer has a second thickness, and wherein a ratio of the first thickness and the second thickness is approximately 4:1.

9. A memory transistor comprising:
a dielectric stack comprising,
  a first oxide layer formed on a substrate,
  a first nitride layer formed on the first oxide layer, the first nitride layer comprising a silicon rich, oxygen-lean oxynitride,
  a second nitride layer formed on the first nitride layer, and
  a second oxide layer formed on the second nitride layer; and
a single-layer gate electrode formed on the second oxide layer of the dielectric stack, wherein the single-layer gate electrode is a high work function gate electrode.

10. The memory transistor of claim 9, wherein the first oxide layer is a tunneling oxide.

11. The memory transistor of claim 9, wherein the first nitride layer further comprises a substantially trap-free oxynitride.

12. The memory transistor of claim 9, wherein the second oxide layer is a high-temperature-oxide (HTO) blocking oxide.

13. The memory transistor of claim 9, wherein the single-layer gate electrode is formed from a doped polysilicon with doped concentration such that the minimum energy to remove an electron from the gate electrode is from approximately 4.8-5.3 electron volts (eV).

14. The memory transistor of claim 9, wherein the first nitride layer has a first thickness and the second nitride layer as a second thickness, and wherein a ratio of the first thickness and the second thickness is approximately 4:1.

15. The memory transistor of claim 9 further comprising sidewall spacers formed adjacent to the dielectric stack and the single-layer gate electrode.

16. A memory device comprising:
a non-volatile memory transistor comprising:
- a charge trapping layer comprising a silicon rich, oxygen-lean oxynitride,
- a tunnel dielectric disposed between the charge trapping layer and a substrate, and
- a blocking oxide disposed between the charge trapping layer and a first single-layer gate electrode;

a logic transistor comprising:
- a second single-layer gate electrode, and
- an oxide disposed between the second polysilicon gate electrode and the substrate; and an isolation structure disposed between the non-volatile memory transistor and the logic transistor,
wherein the first single-layer gate electrode has a first work function and the second single-layer gate electrode has a second work function, wherein the first work function is a high work function.

17. The memory device of claim 16, wherein the charge trapping layer comprises:
- a charge-trapping oxynitride layer; and
- a substantially trap-free oxynitride layer disposed between the charge-trapping oxynitride layer and the tunnel dielectric.

* * * * *